(12) United States Patent
Lourenco et al.

(10) Patent No.: US 12,218,399 B2
(45) Date of Patent: Feb. 4, 2025

(54) SYSTEMS AND METHODS FOR GENERAL-PURPOSE, HIGH-PERFORMANCE TRANSVERSAL FILTER PROCESSING

(71) Applicant: Georgia Tech Research Corporation, Atlanta, GA (US)

(72) Inventors: Nelson Estacio Lourenco, Atlanta, GA (US); Adilson Silva Cardoso, Atlanta, GA (US); Moon-Kyu Cho, Atlanta, GA (US); Christopher Timothy Coen, Atlanta, GA (US); John D. Cressler, Atlanta, GA (US); Douglas Robert Denison, Atlanta, GA (US); William B. Hunter, Atlanta, GA (US); Ickhyun Song, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 18/386,714

(22) Filed: Nov. 3, 2023

(65) Prior Publication Data
US 2024/0063521 A1 Feb. 22, 2024

Related U.S. Application Data

(63) Continuation of application No. 17/440,719, filed as application No. PCT/US2020/023367 on Mar. 18, 2020, now Pat. No. 11,848,475.
(Continued)

(51) Int. Cl.
*H03F 1/18* (2006.01)
*H01P 5/16* (2006.01)
(Continued)

(52) U.S. Cl.
CPC .............. *H01P 5/16* (2013.01); *H03F 3/04* (2013.01); *H03H 11/32* (2013.01); *H03K 19/173* (2013.01); *H03F 2200/294* (2013.01)

(58) Field of Classification Search
None
See application file for complete search history.

(56) References Cited

U.S. PATENT DOCUMENTS 5,872,491 A 2/1999 Kim et al.
7,675,385 B1 3/2010 Mulbrrok et al.
(Continued)

OTHER PUBLICATIONS

International Search Report and Written Opinion from Application No. PCT/US2020/023367 dated Jun. 15, 2020.

*Primary Examiner* — Jeffrey S Zweizig
(74) *Attorney, Agent, or Firm* — Troutman Pepper Hamilton Sanders LLP; Ryan A. Schneider; Haden R. Marrs

(57) ABSTRACT

A transversal radio frequency filter circuit having a low noise amplifier connected along an input signal path, a first power divider connected between the low noise amplifier and four single taps, and an output path connected to the outputs of each of the four single taps. Each of the four single taps having a coefficient control mechanism, a polarity selection mechanism, and a time delay element. The coefficient control mechanism can include a wideband digital step attenuator configured to support high control range of the coefficient. Additionally, the circuit can include a second power divider connected between the outputs of each of the four single taps and the output path. The circuit can further include a field-programmable gate array configured to control coefficient control mechanisms, the polarity selection mechanisms, and the time delay elements (when they are variable time delay elements).

15 Claims, 15 Drawing Sheets

Related U.S. Application Data

(60) Provisional application No. 62/819,786, filed on Mar. 18, 2019.

(51) Int. Cl.
*H03F 3/04* (2006.01)
*H03H 11/32* (2006.01)
*H03K 19/173* (2006.01)

(56) References Cited

U.S. PATENT DOCUMENTS

| | | |
|---|---|---|
| 9,331,737 B2 | 5/2016 | Hong et al. |
| 9,490,963 B2 | 11/2016 | Choi et al. |
| 2002/0000384 A1 | 1/2002 | Suzuki et al. |
| 2010/0259319 A1 | 10/2010 | Chan et al. |
| 2013/0322506 A1 | 12/2013 | Zerbe et al. |
| 2015/0103745 A1 | 4/2015 | Negus et al. |
| 2016/0149543 A1 | 5/2016 | Anderson et al. |
| 2016/0336921 A1 | 11/2016 | Kim et al. |

PERFORMANCE SUMMARY

| | | 0.13 μm SiGe BiCMOS |
|---|---|---|
| Technology | | |
| Bandwidth | GHz | 2 – 20 |
| Gain | dB | 14.3±0.9 dB |
| Noise Figure | dB | 8* |
| Amp. Control Range | dB | 31.5 |
| Amp. Step | dB | 0.5 |
| RMS Amp Error | dB | 0.7* |
| RMS Time Variation | ps | 2* |
| Amp. Imbalance | dB | 4 |
| Phase Imbalance | degree | 2 |
| Supply | V | 3.3 |
| Power | mW | 77.9 |
| Chip size | mm² | 2.37 |

*: 4-20 GHz

FIG. 9A

SYSTEMS AND METHODS FOR GENERAL-PURPOSE, HIGH-PERFORMANCE TRANSVERSAL FILTER PROCESSING

CROSS-REFERENCE TO RELATED APPLICATIONS

This is a continuation application of U.S. application Ser. No. 17/440,719 filed 17 Sep. 2021, which is a National Stage Entry of, and claims priority to, PCT Application No. PCT/US2020/023367, filed on 18 Mar. 2020, which Application claims the benefit of U.S. Provisional Application Ser. No. 62/819,786 filed 18 Mar. 2019, the entire contents and substance of which are incorporated herein by reference in their entirety as if fully set forth below.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

SEQUENCE LISTING

Not Applicable

STATEMENT REGARDING PRIOR DISCLOSURES BY THE INVENTOR OR A JOINT INVENTOR

Not Applicable

BACKGROUND OF THE DISCLOSURE

1. Field of the Invention

Examples of the present disclosure relate to systems and methods for general-purpose, high-performance transversal filter processing, and more particularly to systems and methods for performance transversal filter processing utilizing analog transversal finite-impulse-response (FIR) filters with a large number of time delay taps to enable direct throughput processing of RF signals.

2. Description of Related Art

Wideband and multi-band applications are becoming increasingly important in a variety of radio frequency (RF) communication systems due to the ever-increasing demand for multi-band wireless and satellite communications. Multi-band operations and frequency multiplexing are very useful for improving spectral efficiency, multiple functions, capacity within a single frequency band, as well as heterogeneous types of services. Therefore, developing highly tunable, reconfigurable electronic filters is necessary to provide channel selection and interference prevention.

Electrical filters are used for shaping and modifying electrical signals. One of the most common uses is to filter out, or remove, signal components of a particular frequency or range of frequencies. Filters are sometimes used to process received signals to remove degradation factors often present after a signal transmission so that the received signals take an expected form and thereby produce an expected result. Examples of filter use include audio devices where filters are used to improve the reproduction of the expected sound, in video devices to produce the expected picture, and in data processing devices to produce the correct data.

Recent research has resulted in reconfigurable filters using several approaches, such as discrete-time (DT) charge-domain signal processing, N-path filtering, and mixer-first receiver topology, all with an aim to attain reconfigurability. However, such approaches can support only a narrow range of frequencies and require additional high-speed clock signals with low phase noise.

To support reconfigurable RF filtering for reducing intersymbol interference (ISI) and to improve channel equalization in wideband and optic applications, traveling-wave amplifier (TWA) approaches have been presented in the recent literature. However, these devices suffer from large time delays and impedance variation due to variable gain amplifiers (VGAs), which present changing parasitic capacitance during amplitude control. In addition, the amplitude control range is not sufficient to provide the high tunability required for reconfigurable RF filters.

Adaptive, finite impulse response (FIR) filters address these concerns. FIR filters are versatile signal processing devices whose filter characteristics are determined by a set of multiplying parameters rather than by physical components as in traditional analog filters. The multiplying parameters are frequently programmable values that can be changed to easily alter the filter's characteristics. By altering the characteristics of the filter, it can be made to produce a better representation of the ideal signal despite variations in degradation factors.

FIG. 1 depicts an example of a signal flow diagram of a general time-domain 4-tap FIR filter 100. As shown, the input to the filter, x(t), which is a continuous function of time, is connected to the input of delay line, which contains a desired number of delay elements. As depicted, the delay line comprises a series-connected delay elements $\tau_0$, $\tau_1$, $\tau_2$, $\tau_3$. Each of the delay elements $\tau_0$, $\tau_1$, $\tau_2$, $\tau_3$ is connected to a multiplier circuit $a_0$, $a_1$, $a_2$, $a_3$, which multiplies the signals by a weighting factor. The output lines of the multiplier circuits $a_0$, $a_1$, $a_2$, $a_3$ are connected to the input terminals of summing circuit $\Sigma$. As depicted, the summing circuit $\Sigma$ comprises multiple stages. The output of summing circuit $\Sigma$ is the filter output signal line y(t).

FIR filters, which are fundamental elements in time-domain signal processing, have historically been implemented in digital processors. Digital architectures offer high dynamic range, low noise, scalability, reconfigurability, and ubiquity. However, major drawbacks of digital architectures are limitations in the RF domain due to the Nyquist rate and power requirements of analog-to-digital converters (ADC).

In general, it is desirable for such a core circuit block to be able to provide generalized, dynamically reconfigurable RF components capable of achieving adjustable RF front-end filtering, pre-linearization of the signal for amplifier saturation compensation, and direct throughput matched filtering.

Accordingly, there is a need for improved systems and methods for general-purpose, high-performance transversal filter processing, and more particularly to systems and methods for performance transversal filter processing utilizing analog transversal finite-impulse-response (FIR) filters with a large number of time delay taps to enable direct throughput processing of RF signals. Examples of the present disclosure are directed to these and other considerations.

SUMMARY OF THE INVENTION

Examples of the present disclosure comprise systems and methods for performance transversal filter processing utilizing analog transversal finite-impulse-response (FIR) filters with a large number of time delay taps.

An exemplary embodiment provides a circuit comprising one or more tap signal paths, each tap signal path comprising an input, a coefficient control mechanism, a polarity selection mechanism, and an output, and one or more time delay elements, each time delay element comprising an input, and an output.

In any of the embodiments disclosed herein, the circuit can be a reconfigurable filter for tunable filtering across frequencies from 2 to 20 gigahertz.

In any of the embodiments disclosed herein, the components of the circuit can be dynamically reconfigurable RF components configured to provide one or more features selected from a group consisting of adjustable RF front-end filtering, pre-linearization of a signal for amplifier saturation compensation, direct throughput matched filtering, and a combination thereof.

In any of the embodiments disclosed herein, the circuit can further comprise an input signal path and an output signal path, wherein the input signal path is connected to each of the tap signal path inputs, wherein each tap signal path output is connected to a respective one of the time delay element inputs, and wherein each of the tap signal path outputs is connected to the output signal path.

In any of the embodiments disclosed herein, the circuit can further comprise a first power divider connected between the input signal path and at least one of the one or more tap signal path inputs.

In any of the embodiments disclosed herein, the circuit can further comprise a second power divider connected between at least one of the one or more time delay element outputs and the output signal path.

Another exemplary embodiment provides a circuit comprising single taps, each of the single taps comprising a coefficient control mechanism, and a polarity selection mechanism, time delay elements, and an output signal path, wherein the time delay elements are connected between the single taps and the output signal path.

In any of the embodiments disclosed herein, the circuit can further comprise a first power divider connected to the single taps, and a second power divider connected between the time delay elements and the output signal path.

In any of the embodiments disclosed herein, the circuit can be a reconfigurable filter for tunable filtering across frequencies from 2 to 20 gigahertz.

In any of the embodiments disclosed herein, the components of the circuit can be dynamically reconfigurable RF components configured to provide one or more features selected from a group consisting of adjustable RF front-end filtering, pre-linearization of a signal for amplifier saturation compensation, direct throughput matched filtering, and a combination thereof.

Another exemplary embodiment provides an integrated circuit comprising a first power divider connected to tap signal paths, and an output signal path connected to an output of each tap signal path, wherein each tap signal path comprises a coefficient control mechanism, a polarity selection mechanism, and a time delay element.

In any of the embodiments disclosed herein, the coefficient control mechanism can be selected from a group consisting of a wideband digital step attenuator, a variable digital attenuator, a variable analog attenuator, a variable gain amplifier, a vector modulator, and a combination thereof.

In any of the embodiments disclosed herein, the polarity selection mechanism can comprise one or more components selected from a group consisting of a switch, an active balun, a passive balun, a transformer, a phase shifter, a vector modulator, and a combination thereof.

In any of the embodiments disclosed herein, the time delay element can be selected from a group consisting of a fixed delay element, a variable delay element, and a combination thereof.

In any of the embodiments disclosed herein, the integrated circuit can further comprise a field-programmable gate array configured to control one or more of the coefficient control mechanism, the polarity selection mechanism, or the (variable) time delay element.

In any of the embodiments disclosed herein, the integrated circuit can be a transversal radio frequency filter integrated circuit.

In any of the embodiments disclosed herein, the circuit can further comprise a wideband reconfigurable transceiver connected to one of an input signal path and the output signal path.

In any of the embodiments disclosed herein, the integrated circuit can further comprise a first amplifier and a second power divider, wherein the integrated circuit is a transversal radio frequency filter integrated circuit, wherein the first power divider is connected between the first amplifier and tap signal paths, and wherein the second power divider is connected between the output of each tap signal path and the output signal path.

In any of the embodiments disclosed herein, the first power divider can comprise a wideband active power divider.

In any of the embodiments disclosed herein, the second power divider can comprise a Wilkinson Power Divider.

In any of the embodiments disclosed herein, a time delay of each of the tap signal paths can be configured to provide a fixed time delay to a signal traversing the corresponding tap signal path.

In any of the embodiments disclosed herein, the time delay of each of the tap signal paths can be in an active inductance peaking delay configuration.

In any of the embodiments disclosed herein, the coefficient control mechanism can comprise a wideband digital step attenuator configured to support high control range of the coefficient control mechanism.

In any of the embodiments disclosed herein, the polarity selector mechanism can comprise a wideband balun and a switch.

Another exemplary embodiment provides a transversal radio frequency filter integrated circuit comprising a low noise amplifier, a first power divider, and an output signal path. The low noise amplifier can be connected along an input signal path. The first power divider can be connected between the low noise amplifier and a plurality of single taps. Each of the plurality of single taps can comprise a coefficient controller, a polarity selector, a time delay, and an output. The output signal path can be connected to the outputs of each of the plurality of single taps.

In any of the embodiments disclosed herein, the integrated circuit can be fabricated in Silicon Germanium (SiGe).

In any of the embodiments disclosed herein, the integrated circuit can further comprise a second power divider connected between the outputs of each of the plurality of single taps and the output signal path.

In any of the embodiments disclosed herein, the time delay of each of the plurality of single taps can be configured to provide a fixed time delay to a signal traversing the corresponding single tap.

In any of the embodiments disclosed herein, the time delay comprises a grounded coplanar waveguide line.

In any of the embodiments disclosed herein, the coefficient controller can comprise a wideband digital step attenuator configured to support high control range of the coefficient controller.

In any of the embodiments disclosed herein, the polarity selector can comprise a wideband balun and a switch.

In any of the embodiments disclosed herein, the integrated circuit can further comprise a wideband reconfigurable transceiver connected to one of the input signal path and the output signal path.

In any of the embodiments disclosed herein, the first power divider can comprise a wideband active power divider.

In any of the embodiments disclosed herein, the first power divider can comprise a Wilkinson Power Divider.

In any of the embodiments disclosed herein, the second power divider can comprise a Wilkinson Power Divider.

In any of the embodiments disclosed herein, the integrated circuit can further comprise a field-programmable gate array configured to control the coefficient controller, the polarity selector, and the (variable) time delay or each of the plurality of single taps.

Another embodiment provides an integrated circuit comprising a first power divider and single taps, each of the single taps comprising a coefficient controller, a polarity selector, a time delay, and an output, and an output signal path connected to the outputs of each of the single taps.

In any of the embodiments disclosed herein, the integrated circuit can be fabricated in Silicon Germanium (SiGe).

In any of the embodiments disclosed herein, the integrated circuit can further comprise the amplifier and a second power divider, wherein the integrated circuit is a transversal radio frequency filter integrated circuit, wherein the amplifier is a low noise amplifier connected along an input signal path, and wherein the second power divider is connected between the outputs of each of the single taps and the output signal path.

In any of the embodiments disclosed herein, the time delay of each of the single taps can be configured to provide a fixed time delay to a signal traversing the corresponding single tap.

In any of the embodiments disclosed herein, the time delay can be in an active inductance peaking delay configuration.

In any of the embodiments disclosed herein, the coefficient controller can comprise a wideband digital step attenuator configured to support high control range of the coefficient controller.

In any of the embodiments disclosed herein, the polarity selector can comprise a wideband balun and a switch.

In any of the embodiments disclosed herein, the integrated circuit can further comprise a wideband reconfigurable transceiver connected to one of the input signal path and the output signal path.

In any of the embodiments disclosed herein, the first power divider can comprise a wideband active power divider.

In any of the embodiments disclosed herein, the second power divider can comprise a Wilkinson Power Divider.

In any of the embodiments disclosed herein, the integrated circuit can further comprise a field-programmable gate array configured to control the coefficient controller, the polarity selector, and the (variable) time delay or each of the single taps.

Another embodiment provides a circuit comprising a low noise amplifier, a four-way power divider, and an output path. The low noise amplifier can be connected along an input signal path. The four-way power divider can be connected between the low noise amplifier and four intermediary signal paths. A first intermediary signal path of the four intermediary signal paths can comprise a variable attenuator, an active balun, a switch, and a reconfigurable power divider. The remaining signal paths of the four intermediary signal paths can comprise a first fixed time delay, a variable attenuator, an active balun, a switch, a reconfigurable power divider, and a second fixed time delay. The output path can be connected to outputs of each of the four intermediary signal paths.

In any of the embodiments disclosed herein, the first fixed time delay can be in an active inductance peaking delay configuration.

In any of the embodiments disclosed herein, the four-way power divider can comprise a Wilkinson Power Divider.

In any of the embodiments disclosed herein, at least one of the four intermediary signal paths is phase shifted by 180°.

Another embodiment provides a circuit comprising a low noise amplifier, a first multi-stage power divider, and a second multi-stage power divider. The low noise amplifier can be connected along an input signal path. The first multi-stage power divider can be connected between the low noise amplifier and four intermediary signal paths. Each of the four intermediary signal paths can comprise a fixed time delay, a four-tap monolithic microwave integrated circuit, and an output path. Each four-tap monolithic microwave integrated circuit can comprise a first intermediary signal path of four intermediary signal paths. The first intermediary signal path can comprise a variable attenuator, an active balun, and a switch. Each of the three remaining signal paths of the four intermediary signal paths can comprise a first fixed time delay, a variable attenuator, an active balun, a switch, and a second fixed time delay. The output path can be connected to the outputs of each of the four intermediary signal paths. The second multi-stage power divider can be connected between the output paths of each four-tap monolithic microwave integrated circuit and a circuit output signal path.

In any of the embodiments disclosed herein, each output path of the four-tap monolithic microwave integrated circuit can be further connected to a testing circuit configured to provide for active interrogation of individual taps.

In any of the embodiments disclosed herein, the testing circuit can comprise a reconfigurable power divider. Further features of the disclosed design, and the advantages offered thereby, are explained in greater detail hereinafter with reference to specific examples illustrated in the accompanying drawings, wherein like elements are indicated be like reference designators.

BRIEF DESCRIPTION OF THE DRAWINGS

Reference will now be made to the accompanying drawings, which are not necessarily drawn to scale, are incorporated into, and constitute a portion of, this disclosure, illustrate various implementations and aspects of the disclosed technology and, together with the description, serve to explain the principles of the disclosed technology. In the drawings:

FIGS. 9A-9G depict measured performance results for the fabricated single-tap transversal radio frequency filter integrated circuit of FIG. 8, in accordance with an example of the present disclosure.

DETAIL DESCRIPTION OF THE INVENTION

Examples of the present disclosure relate to systems and methods for general-purpose, high-performance transversal filter processing, and more particularly to systems and methods for performance transversal filter processing utilizing analog transversal finite-impulse-response (FIR) filters with a large number of time delay taps to enable direct throughput processing of RF signals. Throughout much of the discussion herein, the elements of the systems are described with respect to single or four tap modules of the high-performance transversal filter monolithic microwave integrated circuit; however, as will be appreciated by one of skill, the principals can apply to any number of taps depending on the desired application.

As will be appreciated, the adaptive, analog FIR filter integrated circuit disclosed provides a generalized, dynamically-reconfigurable RF component that can realize, for example, tunable RF front-end filtering, pre-linearization of signals for amplifier saturation compensation (leading to more efficient power amplifier operating modes), direct throughput matched filtering, cancelling transmit leakage, as well as many other tasks necessary for direct-throughput processing of RF signals in the microwave and millimeter-wave spectrum.

Some implementations of the disclosed technology will be described more fully with reference to the accompanying drawings. This disclosed technology, however, may be embodied in many different forms and should not be construed as limited to the implementations set forth herein. The components described hereinafter as making up various elements of the disclosed technology are intended to be illustrative and not restrictive. Many suitable components that could perform the same or similar functions as components described herein are intended to be embraced within the scope of the disclosed systems and methods. Such other components not described herein may include, but are not limited to, for example, components developed after development of the disclosed technology.

The components described hereinafter as making up various elements of the disclosed technology are intended to be illustrative and not restrictive. Many suitable components that would perform the same or similar functions as the components described herein are intended to be embraced within the scope of the disclosed technology. Such other components not described herein can include, but are not limited to, similar components that are developed after development of the presently disclosed subject matter.

Figure 1:
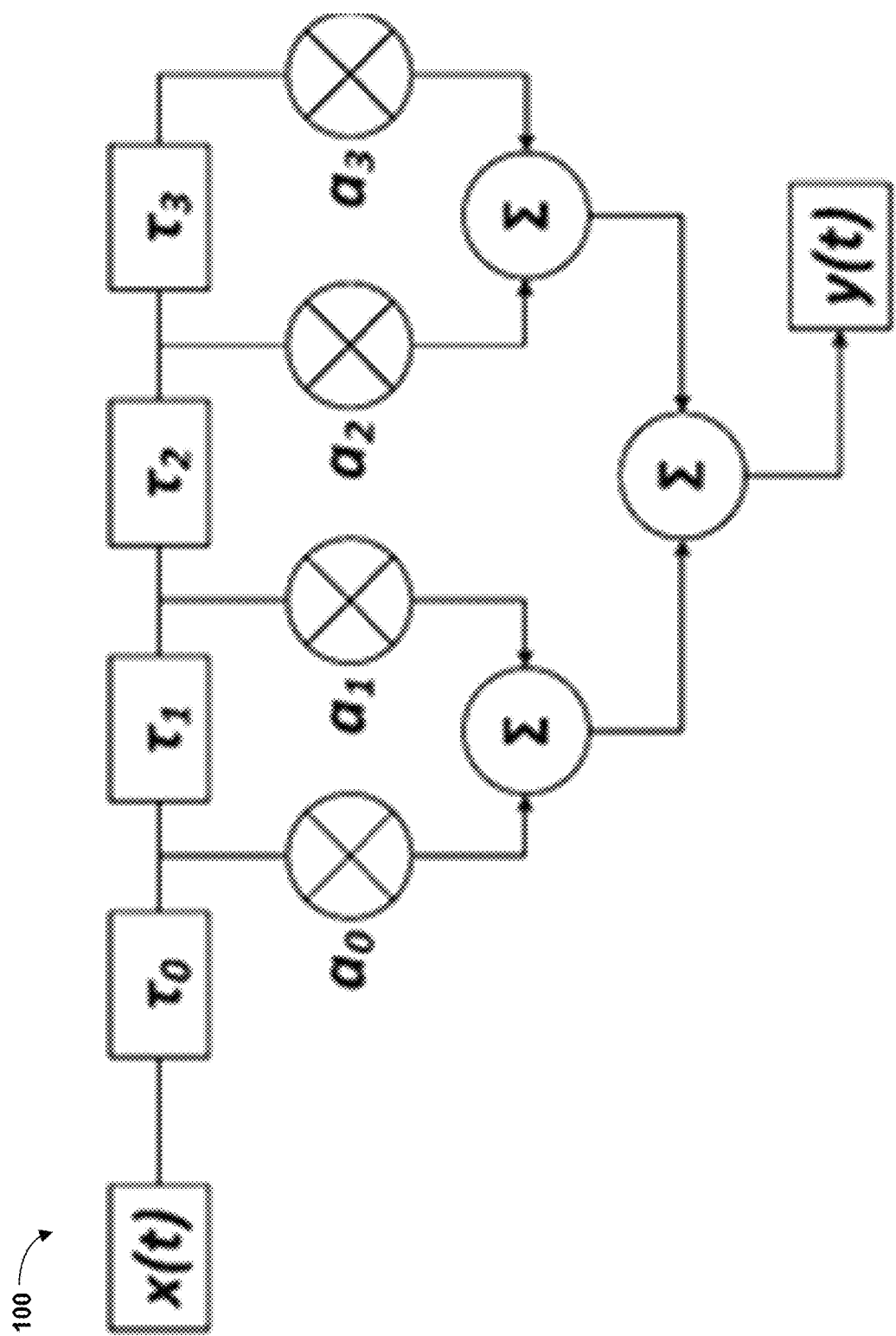
FIG. 1 is an example of a signal flow diagram of a general time-domain 4-tap FIR filter.
Figure 2A:
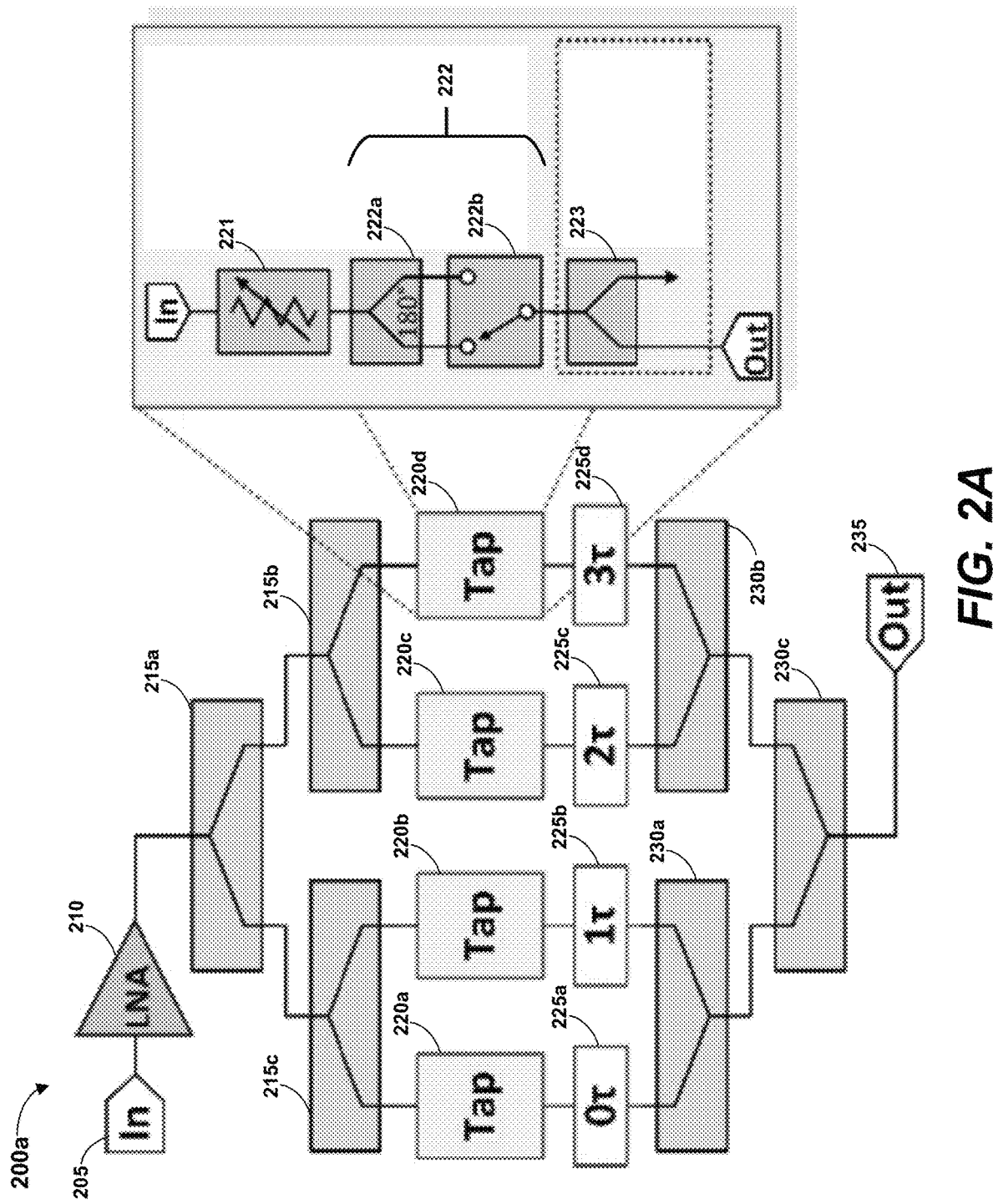
FIG. 2A is a block diagram of a multi-tap transversal radio frequency filter integrated circuit incorporating analog FIR filters, in accordance with an example of the present disclosure.

FIG. 2A illustrates a block diagram of a multi-tap transversal radio frequency filter integrated circuit 200a having one or more taps 220a-220d. The illustrated circuit 200a comprises an input signal path 205, a low noise amplifier 210, a first power divider stage 215, one or more taps 220a-220d, one or more time delay elements 225a-225d, a second power divider 230, and an output signal path 235. As depicted, each of the one or more taps 220a-220d comprises a coefficient control mechanism 221, a polarity selection mechanism 222, and an open-loop control mechanism 223. The output of the filter 235 is created as a superposition of delayed (e.g., via one or more time delay elements 225a-225d) and weighted (e.g., via at least one of the coefficient control mechanism 221 or polarity selection mechanism 222) versions of the input. As will be appreciated, the delaying and weighting can be configured based on the desired operational characteristics of the filter 200a. For example, tap weights can be configured to optimize operation across a specific frequency wave band, such as the X band. Further, and as discussed with reference to FIG. 3, multiple taps 220a-220d may be used to obtain broad, or wideband, spectral coverage.

Although the illustrated circuit shows an amplifier 210 at the input stage of the circuit, one of skill in the art will appreciate that an amplifier is not required to implement the architecture of the present invention. The use of an amplifier may be discouraged in certain applications to help improve power handling and dynamic range of a particular chip. One example is the use of the present invention as a reconfigurable front-end filer within an RF transceiver (i.e., a wideband filter between the T/R module and up-/down-conversion electronics in RF transceivers). While man implementations of the present chip architecture will use amplifiers, a core functionality of the present invention does not change whether or not an amplifier is included. Further, while some embodiments recite the amplifier as a low-noise amplifier, in some implementations the "low-noise" feature may not be essential and a general "amplifier" would suffice.

As depicted, the integrated circuit 200a uses a distributed architecture that is analogous to a traveling-wave amplifier operating in the reverse gain mode. The input RF signal (e.g., via input signal path 205) propagates along the delay lines (e.g., via time delay elements 225a-225d). Accordingly, the signal and the delayed versions of the signal are tapped along the delay lines and multiplied by the coefficients (weights) (e.g., via coefficient control mechanism 221) and summed to generate the weighted and delayed output signal (e.g., via second power divider 230). As will be appreciated, the delay at the output terminal is a combination of the input and output transmission line delays as each stage is enabled.

As further depicted in FIG. 2A, coefficient control mechanism 221 can comprise an attenuation, or gain, stage. As shown, the output of the first power divider stage 215 can be received by the coefficient control mechanism 221, which can attenuate the signal. The attenuation stage can be an analog multiplier with a high-speed data input and a low-speed control signal that presents a constant load to both the input and the output transmission lines as the weight coefficients are changed to maintain a constant delay between stages of the integrated circuit 200a. For example, coefficient control mechanism 221 can include a wideband attenuator and/or a variable attenuator, which can be adapted to attenuate the signal received from the first power divider 215. Further, the coefficient control mechanism 221 can comprise a variable gain amplifier (VGA), which can be adapted to attenuate the signal received from the first power divider 215. Further, the coefficient control mechanism 221 can comprise a modified Gilbert cell structure.

Although embodiments of the coefficient control mechanism 221 are disclosed as either a wideband digital step attenuator or a variable attenuator, one of skill in the art will appreciate that other methods of coefficient control (e.g., variable analog attenuator, variable gain amplifier, vector modulator) could be used in the present invention's architecture.

Additionally, as depicted in FIG. 2A, polarity selection mechanism 222 can comprise wideband balun 222a and single pole double throw (SPDT) switch 222b. As shown, the output of the first power divider stage 215 can be received by the coefficient control mechanism 221, which can attenuate the signal before the polarity selection mechanism 222 receives the signal. As further depicted, the wideband balun 222a can receive the signal and can split the signal into a pair of output signals having equal amplitudes and 180° phase shift difference. As further depicted, the SPDT switch 222b can be connected to the output of the wideband balun 222a such that the SPDT switch 222b can be utilized to select the wideband balun 222a output signal of choice. As will be appreciated, the combination of the coefficient control mechanism 221 and polarity selection mechanism 222 allows each tap 220a-220d to provide both positive and negative tap weights.

Although embodiments of the polarity selection mechanism 222 are disclosed as a wideband balun (or active balun) and a switch, one of skill in the art will appreciate that other methods of polarity selection or control (e.g., passive balun, 180° hybrid, transformer, phase shifter, vector modulator, time delay element) could be used in the present invention's architecture.

FIG. 2A further depicts an open loop control mechanism 223 configured to allow for active interrogation of individual taps while monitoring the summed FIR output. In some examples, the open loop control mechanism 223 can include tuning algorithms implemented on field-programmable gate arrays (FPGAs).

Figure 2B:
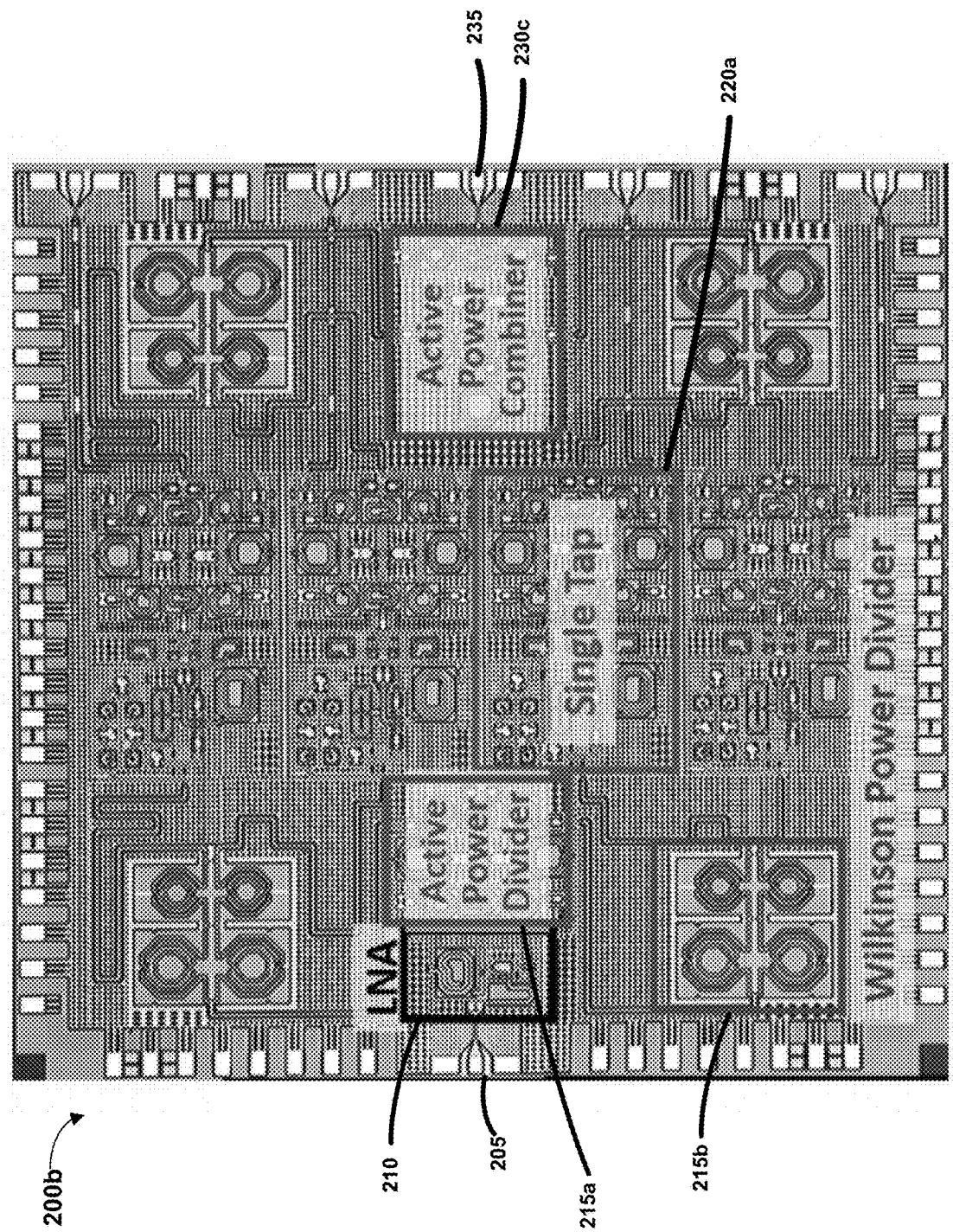
FIG. 2B is an annotated microphotograph of a fabricated multi-tap transversal radio frequency filter integrated circuit of FIG. 2A, in accordance with an example of the present disclosure.

FIG. 2B is an annotated microphotograph of a fabricated multi-tap transversal radio frequency filter integrated circuit of FIG. 2A, in accordance with an example of the present disclosure. As depicted, the fabricated circuit 200b includes an input signal path 205, a low noise amplifier 210, a first power divider 215a-215b, a tap 220a, a second power divider 230c, and an output signal path 235. The fabricated multi-tap circuit 200b was implemented in a Global Foundries 130 nm SiGe HBT BiCMOS technology (GF 8HP) with a chip size of 3.84 mm×3.98 mm.

Figure 3:
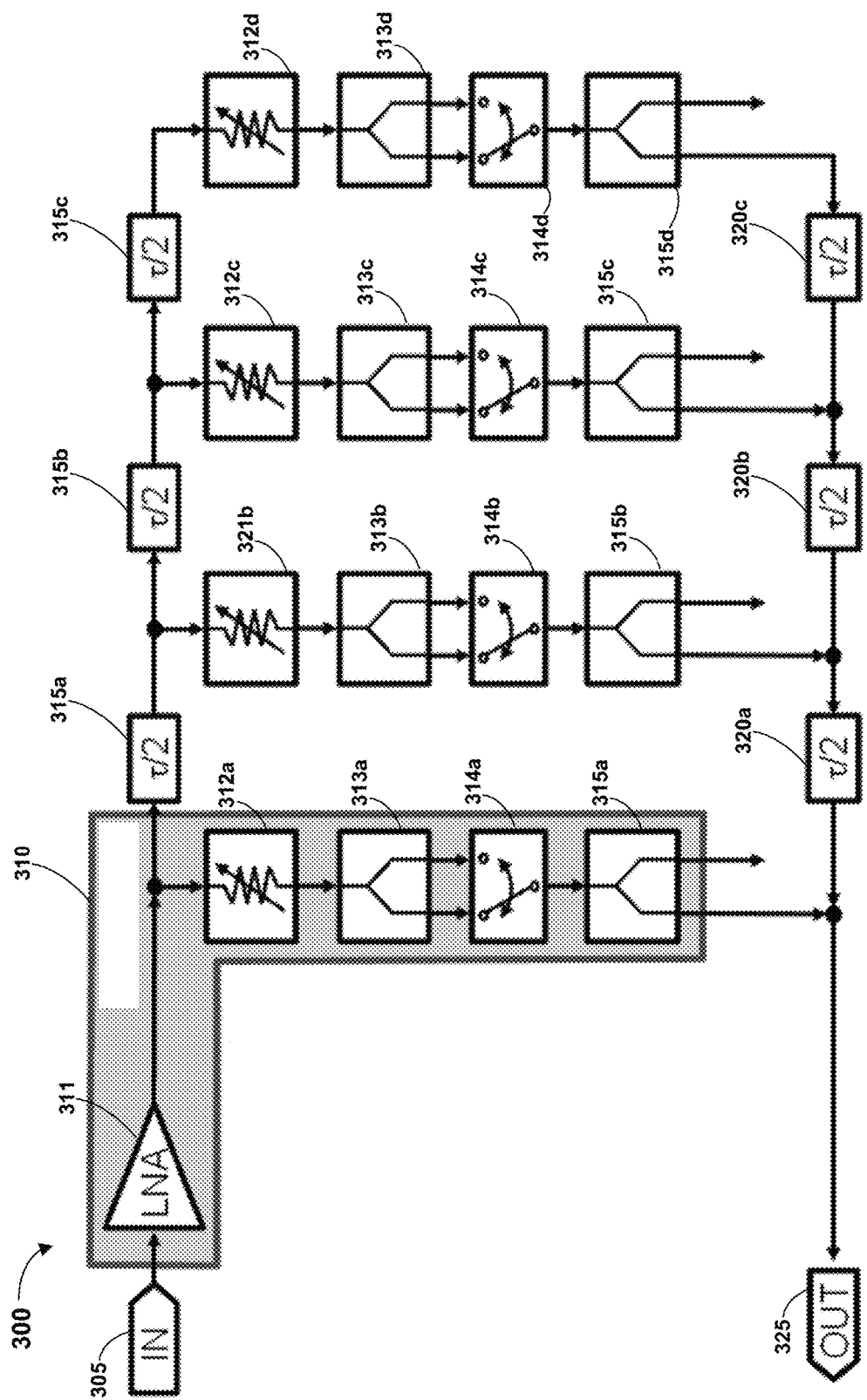
FIG. 3 is a block diagram of a four-tap transversal radio frequency filter circuit, in accordance with an example of the present disclosure.

FIG. 3 is a block diagram of a four-tap transversal radio frequency filter circuit 300, in accordance with an example of the present disclosure. As shown, the circuit 300 can include an input signal path 305, a low noise amplifier 311, one or more first time delay elements, 315a-315c, one or more tap signal paths, one or more second time delay elements, 320a-320c, and an output signal path 325. As further depicted, the one or more tap signal paths can include coefficient control mechanism 312a-312d, wideband balun 313a-313d, SPDT switch 314a-314d, and open loop control mechanism 315a-315d. The output of the filter 325 is created as a superposition of delayed (e.g., via one or more first time delay elements 315a-315c and one or more second time delay elements 320a-320c) and weighted (e.g., via at least one or more tap signal paths) versions of the input.

As further depicted, coefficient control mechanism 312a-312d can comprise an attenuation, or gain, stage. The attenuation stage can be an analog multiplier with a high-speed data input and a low-speed control signal that presents a constant load to both the input and the output transmission lines as the weight coefficients are changed to maintain a constant delay between stages of the integrated circuit 300. For example, coefficient control mechanism 312a-312d can include a wideband attenuator and/or a variable attenuator, which can be adapted to attenuate the signal received from the LNA 311. Further, the coefficient control mechanism 312a-312d can comprise a variable gain amplifier (VGA), which can be adapted to attenuate the signal received from the LNA 311. Further, the coefficient control mechanism 312a-312d can comprise a modified Gilbert cell structure.

Additionally, as depicted, the circuit 300 comprises wideband balun 313a-313d and SPDT switch 314a-314d. As shown, the output of the LNA 311 can be received by the coefficient control mechanism 312a-312d, which can attenuate the signal before the wideband balun 313a-313d receives the signal. As further depicted, the wideband balun 313a-313d can receive the signal and can split the signal into to a pair of output signals having equal amplitudes and 180° phase shift difference. As further depicted, the SPDT switch 314a-314d can be connected to the output of the wideband balun 222a such that the SPDT switch 314a-314d can be utilized to select the wideband balun 222a output signal of choice. As will be appreciated, the combination of the coefficient control mechanism 312a-312d and wideband balun 313a-313d and SPDT switch 314a-314d allows each tap signal path to provide both positive and negative tap weights.

As further depicted, the circuit 300 can include an open loop control mechanism 315a-315d configured to allow for active interrogation of individual tap signal paths while monitoring the summed FIR output. In some examples, the open loop control mechanism 315a-315d can include tuning algorithms implemented on field-programmable gate arrays (FPGAs).

Although embodiments of the present invention use a field programmable gate array (FPGA) to control one or more of the coefficient control mechanism, the polarity selection mechanism, or the (variable) time delay element, one of skill in the art will appreciate that other control circuitry (e.g., microcontroller, on-chip processing unit) could be used to provide user or algorithmic control of these components.

Figure 4A:
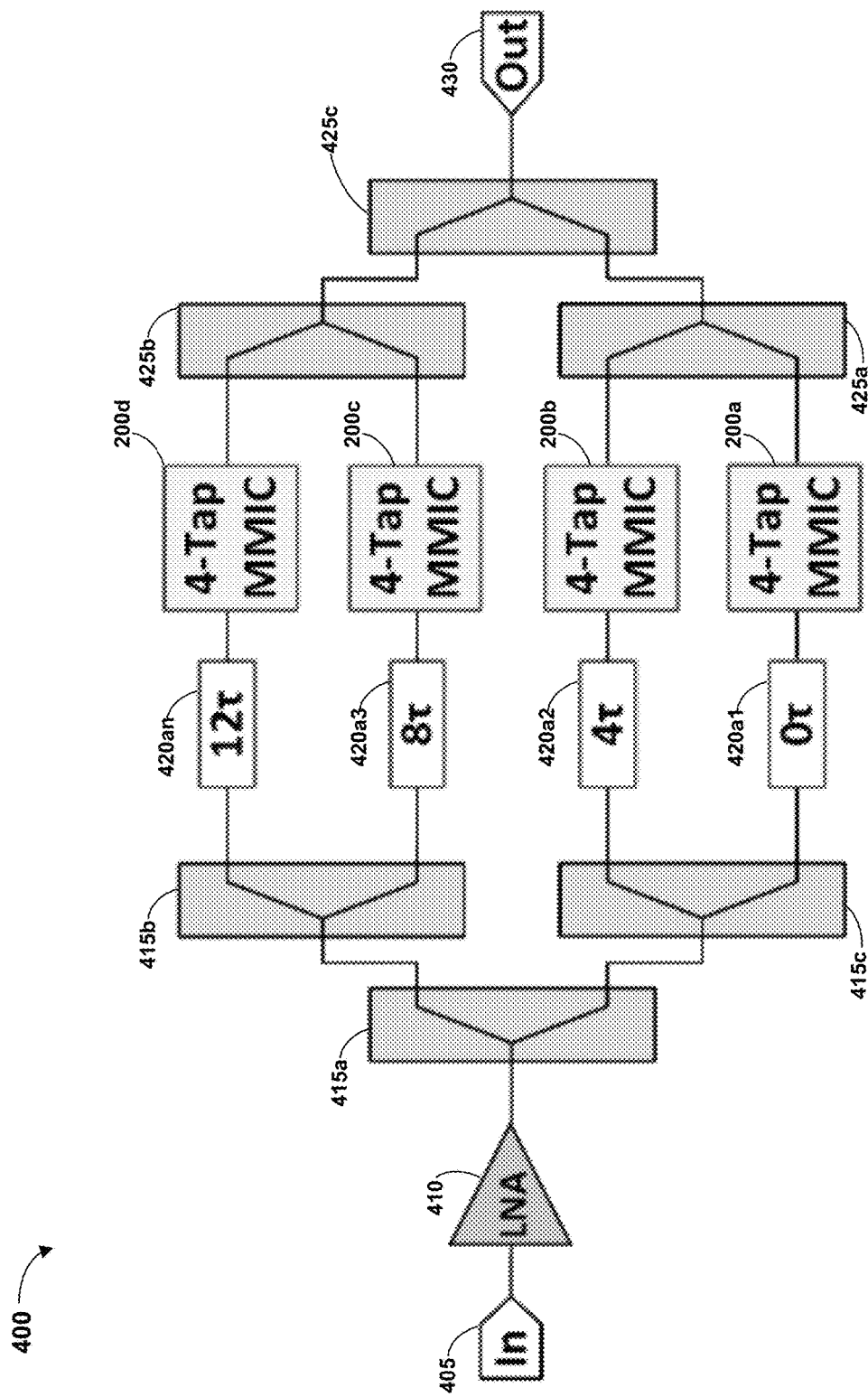
FIG. 4A is a block diagram of a 16-tap transversal radio frequency filter circuit incorporating analog FIR filters, in accordance with an example of the present disclosure.

FIG. 4A is a block diagram of a 16-tap transversal radio frequency filter circuit 400 incorporating analog FIR filters, in accordance with an example of the present disclosure. As shown, the circuit 400 includes an input signal path 405, a low noise amplifier 410, a first power divider stage 415, one or more time delay elements 420a-420d, one or more four-tap circuits $220a_1$-$220_n$, a second power divider stage 425, and an output signal path 420. The output of the filter 420 is created as a superposition of delayed (e.g., via one or more time delay elements 420a-420d and one or more four-tap circuits $220a_1$-$220_n$) and weighted (e.g., via at least one or more four-tap circuits $220a_1$-$220_n$) versions of the input.

As will be appreciated, the delaying and weighting can be configured based on the desired operational characteristics of the filter 400. For example, tap weights can be configured to optimize operation across a specific frequency wave band, such as the X band. As depicted, the circuit 400 can include multiple four-tap circuits $200a_1$-$200a_n$ connected in parallel. Such connection, as will be appreciated, can occur at die level (e.g., as multi-chip modules) or at the PCB level. As will be further appreciated, the system architecture of filter 400 is similar to the integrated four-tap circuit 200a, except that each single tap 220a-220d is replaced with a four-tap circuits $200a_1$-$200a_n$ and the time delay elements 420a-420d are scaled appropriately. In some examples, the intertap delay ($\tau$) can be 20 ps. For example, time delay element 420a can be 0$\tau$, or 0 ps, time delay element 420b can be 4$\tau$ or 80 ps, time delay element 420c can be 8$\tau$ or 160 ps, and time delay element 420d can be 12$\tau$ or 240 ps. As previously discussed, the time delay elements can be either variable or fixed and can be customized based on the desired application for the respective circuits.

Although embodiments of the delay element are fixed delay elements, the delay value of such embodiments sets the maximum frequency that can be processed under certain configurations (i.e., the present invention configured as an RF filter). However, one of skill in the art will appreciate that variable time delay elements are possible under the present architecture which enable new and unique signal processing techniques.

Although embodiments of the time delay element are described as in an active inductance peaking delay configuration, one of skill in the art will appreciate that the present architecture is not dependent on any specific true time delay implementation. Any method for providing a fixed (or variable) time delay element, such as physical delay lines (coax, stripline, microstrip, etc.), fixed artificial transmission lines (lumped LC), switched-path time delays, etc., are potential options if they can satisfy one or more of system performance metrics (e.g., instantaneous bandwidth, insertion loss (or gain), physical dimensions, etc.).

Although embodiments of the circuit are disclosed as having at least one of four intermediary paths being phase shifted by 180°, one of skill in the art will appreciate that there is some tolerance to this phase shift—near-identical performance would be achieved if the phase shift was in the range of roughly 175°-185°, for example. Furthermore, the true goal is to invert the polarity of the signal—a 180° phase shift is just a possible way to achieve this goal, while other techniques exist to accomplish this (another time delay, for example). Thus, in alternative language, one of the four intermediary paths inverts the polarity of the signal.

Figures 4B, 4C:
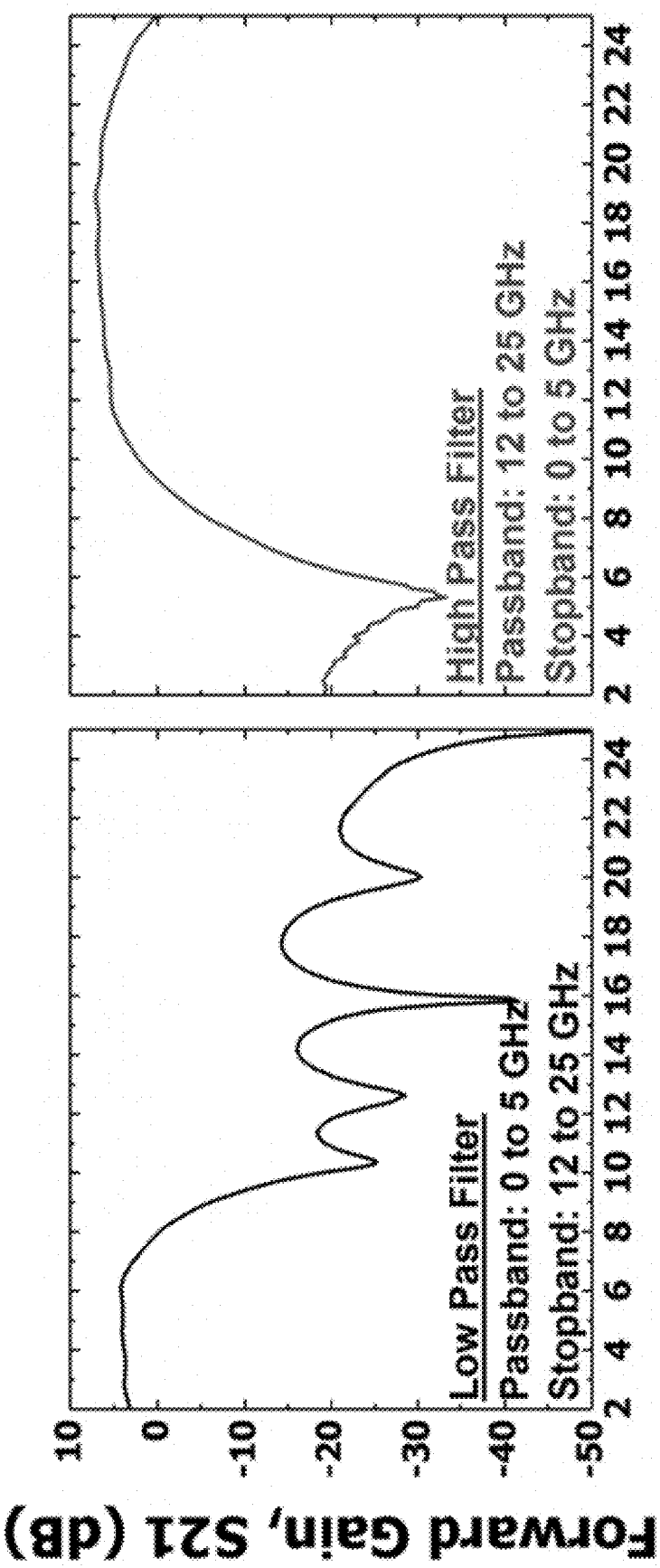
FIGS. 4B-4E depict simulation results for the 16-tap transversal radio frequency filter circuit of FIG. 4A, in accordance with an example of the present disclosure.
Figures 4D, 4E:
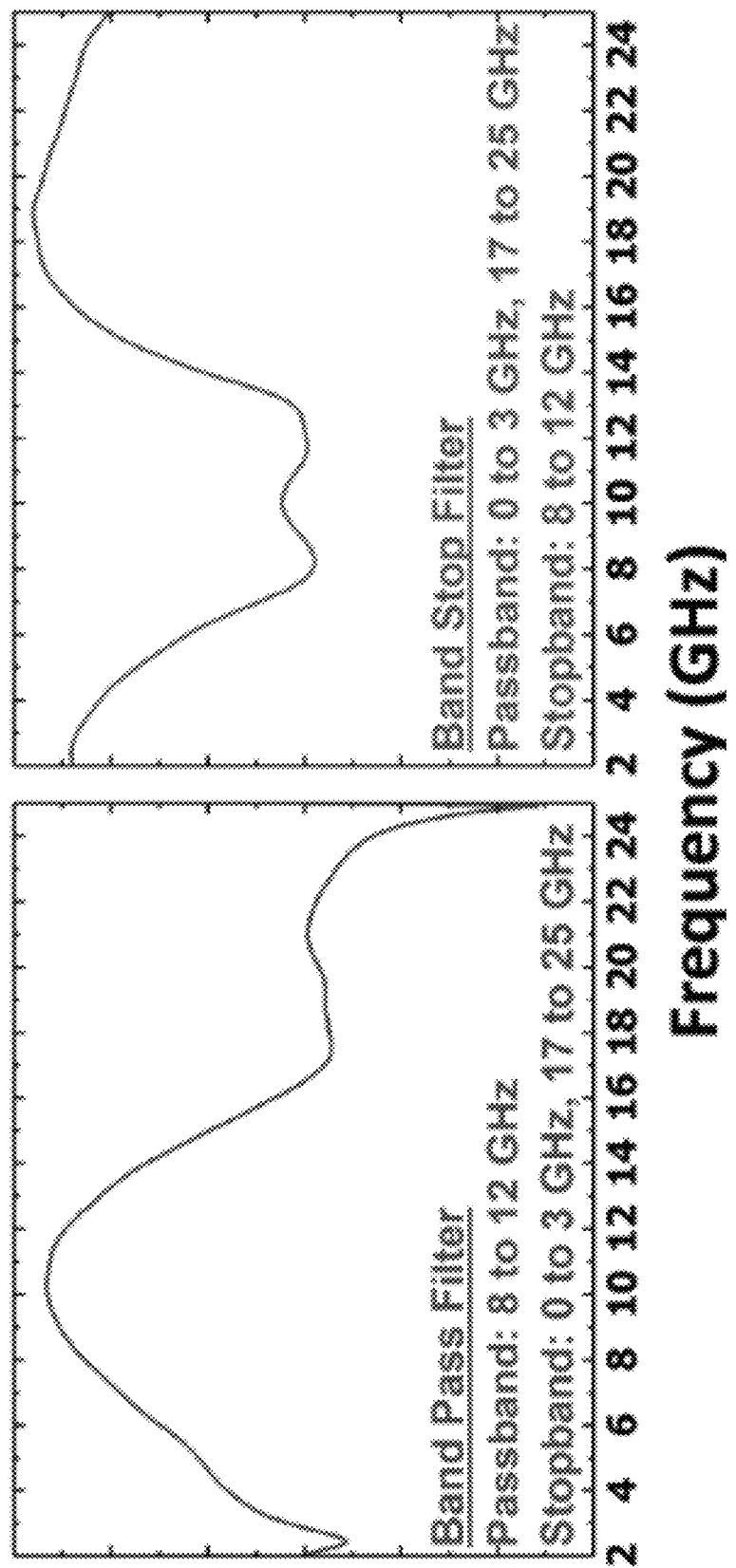

FIGS. 4B-4E depict simulation results for the 16-tap transversal radio frequency filter circuit 400, in accordance with an example of the present disclosure. FIG. 4B depicts the simulated forward gain ($S_{22}$) for a 16-tap MMIC reconfigurable filter 400 configured as a low pass filter. FIG. 4C depicts the simulated forward gain ($S_{21}$) for a 16-tap MMIC reconfigurable filter 400 configured as a high pass filter. FIG. 4D depicts the simulated forward gain ($S_{21}$) for a 16-tap MMIC reconfigurable filter 400 configured as a band pass filter. FIG. 4E depicts the simulated forward gain ($S_{22}$) for a 16-tap MMIC reconfigurable filter 400 configured as a band stop filter. For all simulations, the inter-tap delay was set to 20 ps (i.e., Nyquist sampling at 25 GHz), the RF input power was set to −25 dBm, and the tap coefficients were optimized to minimize passband ripple. As will be appreciated, the simulation results highlight the high adaptability of 16-tap transversal radio frequency filter integrated circuit 400.

Figure 5A:
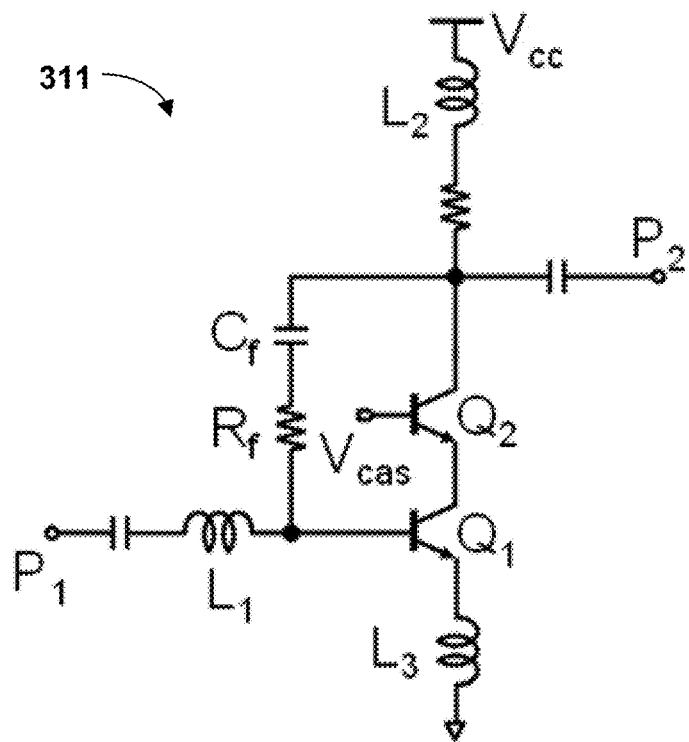
FIG. 5A is a circuit schematic for a wideband low-noise amplifier (LNA), in accordance with an example of the present disclosure.
Figure 5B:
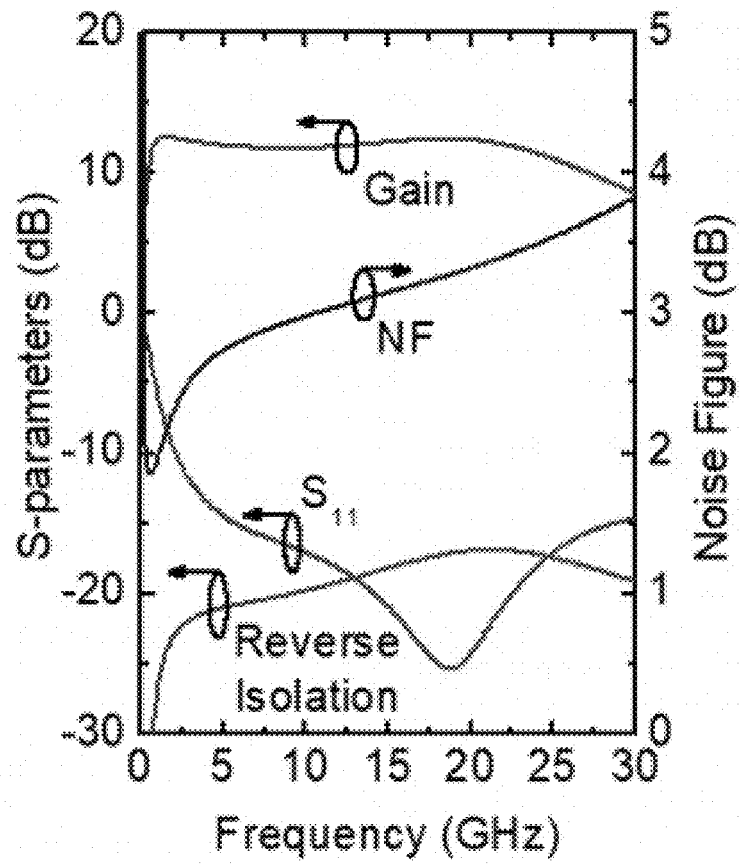
FIG. 5B depicts simulation results for the wideband LNA of FIG. 5A, in accordance with an example of the present disclosure.

FIG. 5A depicts the circuit schematic of the wideband LNA 311, in accordance with examples of the present disclosure. As depicted, the wideband LNA 311 comprises a single inductively degenerated cascode stage with an RC-impedance feedback path. The RC-impedance network can provide wide input matching because it reduces the quality factor of the input series resonance circuit. Further, because the high-frequency power gain of LNAs is degraded by the transistor parasitics, the semiconductor materials can be selected to minimize such effects. For example, in the disclosed embodiment Silicon Germanium heterojunction bipolar transistors (HBTs) were used to minimize these parasitic components and achieve wide operating bandwidth with high-power gain, as they present smaller parasitic capacitance compared to CMOS technologies under the same gm bias conditions. As will be appreciated, the input and output matching inductors ($L_1$ and $L_2$), emitter degeneration inductor ($L_3$), feedback resistor ($R_f$) and capacitor ($C_f$), and the size of transistors can be selected to achieve the optimum performance considering operating bandwidth, power gain, noise figure, and linearity. FIG. 5B depicts the simulation results of the wideband LNA 311, including the gain (S21), Noise Figure (NF), input impedance matching (S11), and reverse isolation (S12).

Although embodiments of the circuit are disclosed as being manufactured with a specific semiconductor technology (Silicon Germanium), one of skill in the art will appreciate that the present circuit is generalizable across any semiconductor process (e.g., RF CMOS, GaAs, GaN, SOI, etc.) as well as heterogeneous combination of multiple chips or COTS components.

Figure 6A:
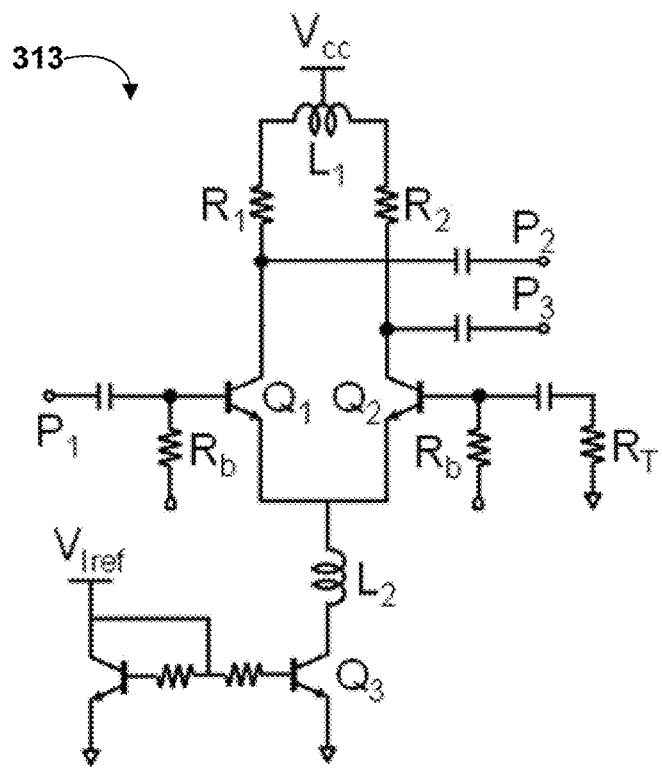
FIG. 6A is a circuit schematic for a wideband active balun, in accordance with an example of the present disclosure.

FIG. 6A depicts the circuit schematic of the wideband active balun 313, in accordance with examples of the present disclosure. As depicted, a single-stage differential amplifier with a common-emitter configuration can generate the differential signal from the single-ended input. Further, with regard to the differential amplifier design, the impedance of the collector node of the current mirroring transistor ($Q_3$) can be infinite when viewed from the common node of the differential pair. However, in the high frequency region, the parasitic capacitance ($C_{CE}$) of transistor ($Q_3$) decreases the impedance of the common node as the frequency increases. Therefore, the amplitude and phase imbalance deteriorate. The inductor ($L_2$) can be added between the common node and the current mirror transistor to increase this impedance.

Figure 6B:
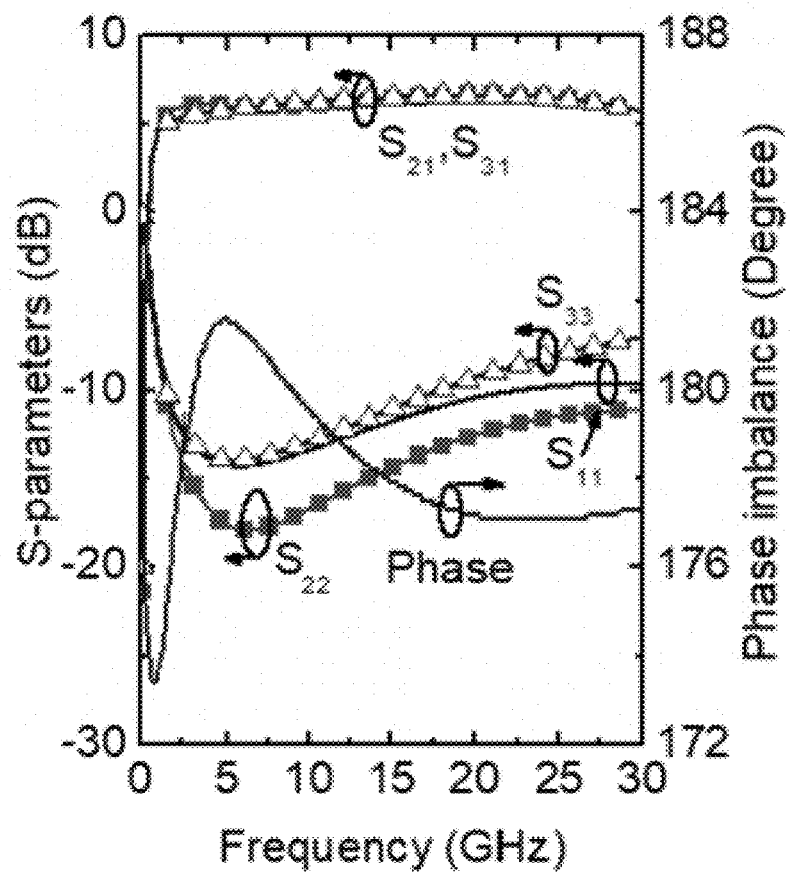
FIG. 6B depicts simulation results for the wideband active balun of FIG. 6A, in accordance with an example of the present disclosure.

At high frequency, the insertion loss of inductor ($L_2$) is increased due to its Q-factor characteristic, but its high impedance can block the main RF signal and maintain the performance of the wideband active balun. A termination resistor ($R_T$) can also be used to improve the phase imbalance and the matching characteristics of port 3 ($P_3$). As shown in FIG. 6B, the wideband active balun exhibits wideband performance with small gain phase imbalance.

As previously discussed, the SPDT switch 314 can provide for negative and positive polarity selectivity. As will be appreciated, circuit 300 will require quick switching time in order to meet the demands of high frequency applications. In order to achieve fast switching time, complementary metal-oxide-semiconductor technology (CMOS) can be used. For example, the switch 314 can comprise BiCMOS (integrated bipolar junction transistor and CMOS gate) technology. However, CMOS also presents high insertion loss and frequency dependent loss characteristics due to its body and N-well diodes. Accordingly, floating body and N-well techniques can be utilized to improve the insertion loss and frequency dependent loss characteristic of the CMOS-based switch.

Figure 7:
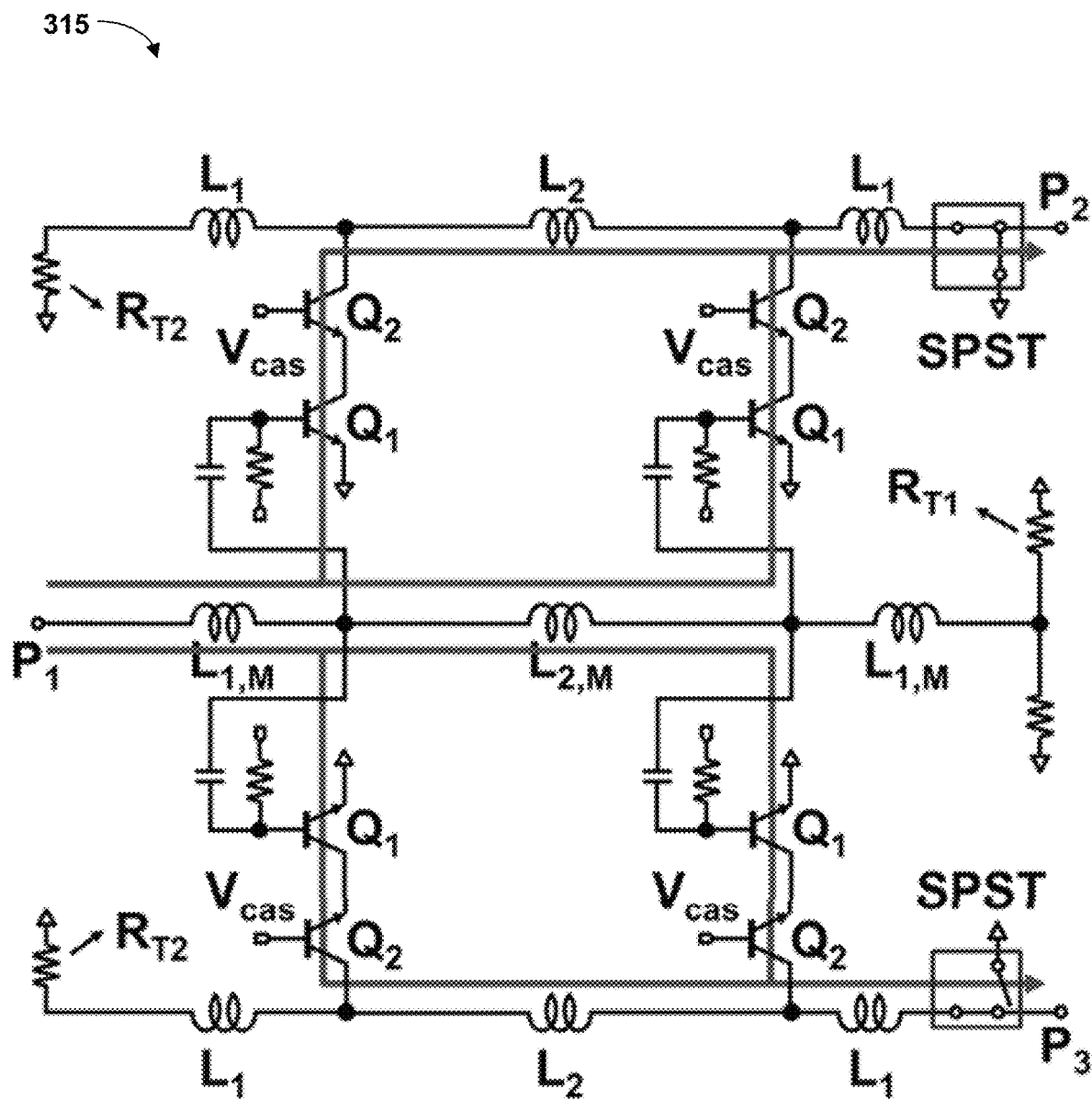
FIG. 7 is a circuit schematic for a switchable two-way wideband active power divider, in accordance with an example of the present disclosure.

FIG. 7 depicts the circuit schematic of a switchable two-way wideband active power divider (e.g., first power divider 215 and/or second power divider 230), in accordance with an example of the present disclosure. The switchable two-way wideband active power divider can include a distributed amplifier (DA) topology with internal RF-choke inductors and DC-blocking capacitors. As will be appreciated, such a topology can ease system integration and allow for achieving wide operational bandwidth, active power gain with good matching characteristics, and moderate linearity. Further, as depicted, single-pole single-throw (SPST) switches can be used at the output ports to provide reconfigurable operation. As will be appreciated, the input and output capacitances of the cascode structure form artificial transmission lines with lumped inductors. In some examples, the artificial input and output lines can be designed to have 50-Ω characteristic impedance and to achieve equal and flat group delay over the required band.

Although embodiments of the specific classes of power dividers are disclosed (active power divider and Wilkinson power divider), one of skill in the art will appreciate that the present architecture is not dependent on these specific power divider implementations. Other power dividers are viable for use within the present architecture. In addition, while an exemplary chip utilized 1:4 power dividers—and thus was a four-tap chip, the present invention can utilize any power divider ratio (i.e., 1:2, 1:3, 1:6, 1:8, etc.) and be realized using a different number of taps, if the design can satisfy one or more of system performance metrics (e.g., instantaneous bandwidth, insertion loss (or gain), physical dimensions, etc.).

As further depicted in FIG. 7, the ends of the artificial transmission lines can be terminated by resistors ($R_T$). Due to the absorption of backward waves by the resistors, such a design can be useful to achieve wideband characteristics. Further, the artificial transmission line of $P_1$ can include inductors $L_{1,M}$, $L_{2,M}$, and the capacitance of the two cascode structures. The artificial transmission line for $P_2$ and $P_3$, can include $L_1$, $L_2$, and the capacitance of a single cascode structure. As will be appreciated, such a design can result in the input capacitance being approximately doubled compared to the output capacitance, thus allowing the propagation velocity at the input and output nodes to exhibit different characteristics. Accordingly, in some examples, multiple stages can be used in order to achieve desired system performance (e.g., wide bandwidth, gain, and output power). As will be appreciated, different phase characteristics will appear at the output nodes of each stage. In some examples, the switchable active power divider 315 can use a two-stage cascode structure in order to achieve the desired frequency range of 2-20 GHz with moderate gain.

Figure 8:
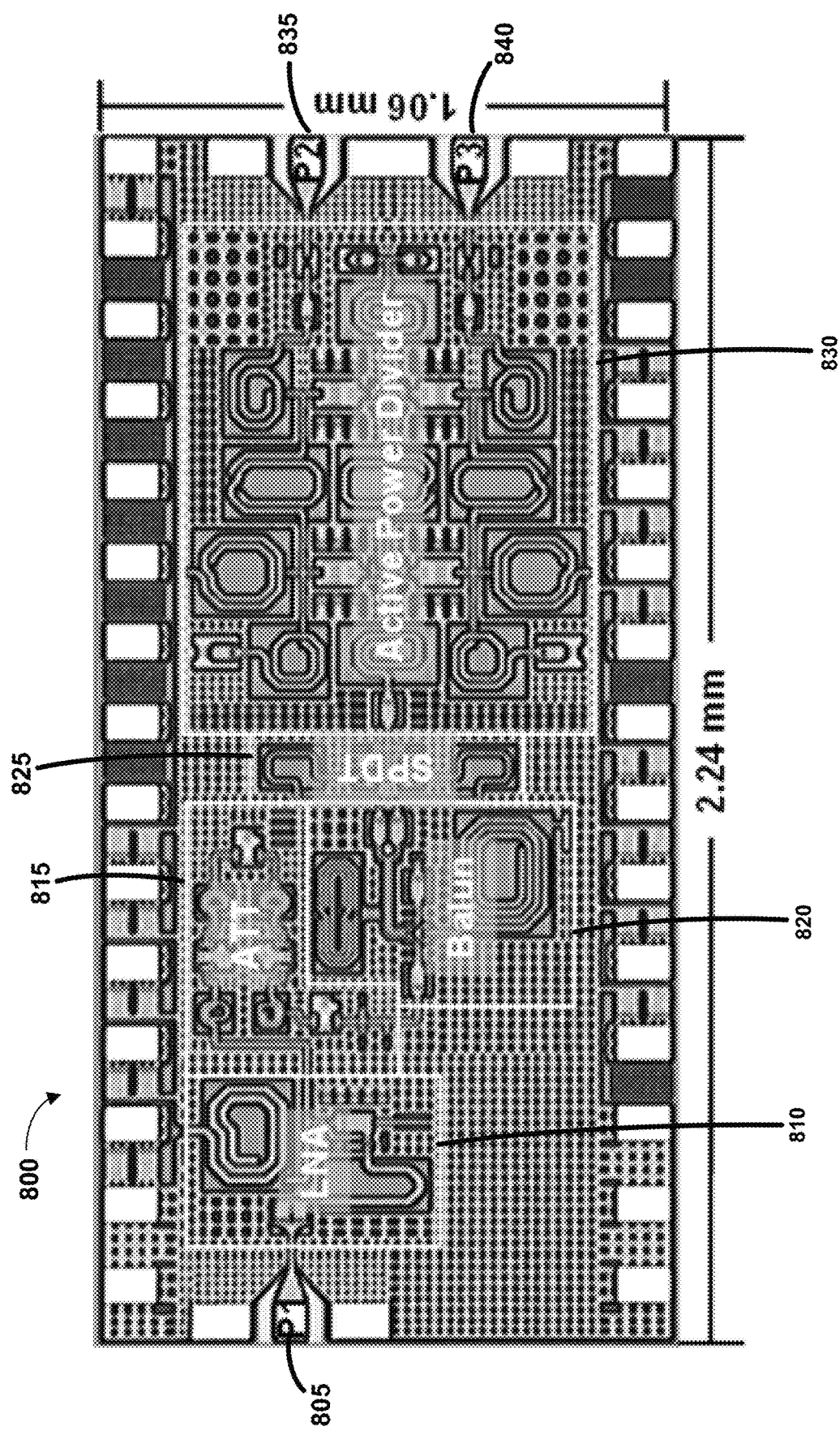
FIG. 8 is an annotated microphotograph of a fabricated single-tap transversal radio frequency filter integrated circuit incorporating an integrated low noise amplifier, in accordance with an example of the present disclosure.

FIG. 8 is an annotated microphotograph of a fabricated single-tap transversal radio frequency filter integrated circuit 800 incorporating an integrated low noise amplifier, in accordance with an example of the present disclosure. As depicted, the circuit 800, includes an input port 805, a LNA 810, an attenuator 815, a wideband active balun 820, an SPDT switch 825, an active power divider 830, an open loop control port 835, and an output port 840. The single-tap circuit 800 was implemented in a Global Foundries 130 nm SiGe HBT BiCMOS technology (GF 8HP) with a chip size of 2.24×1.06 mm. Further, based on a supply voltage of 3.3 V, the circuit 800 consumes a bias current of 23.6 mA.

FIGS. 9A-9G depicts the measured performance summary of the circuit 800. As will be appreciated, the measurement data demonstrates that a SiGe single-tap reconfigurable circuit building block for RF systems has been developed that will enable front-end direct processing of RF signals for frequency filtering, linearization, and matched filtering. Further, the generated circuit 800 exhibits a flat in-band characteristic with a wide range of coefficient control, low noise figure, and differential signal selectivity over the wide operating bandwidth has been demonstrated. In addition, this circuit 800 can support open-loop systems by using optimized switchable active power divider.

Figures 9B, 9C:
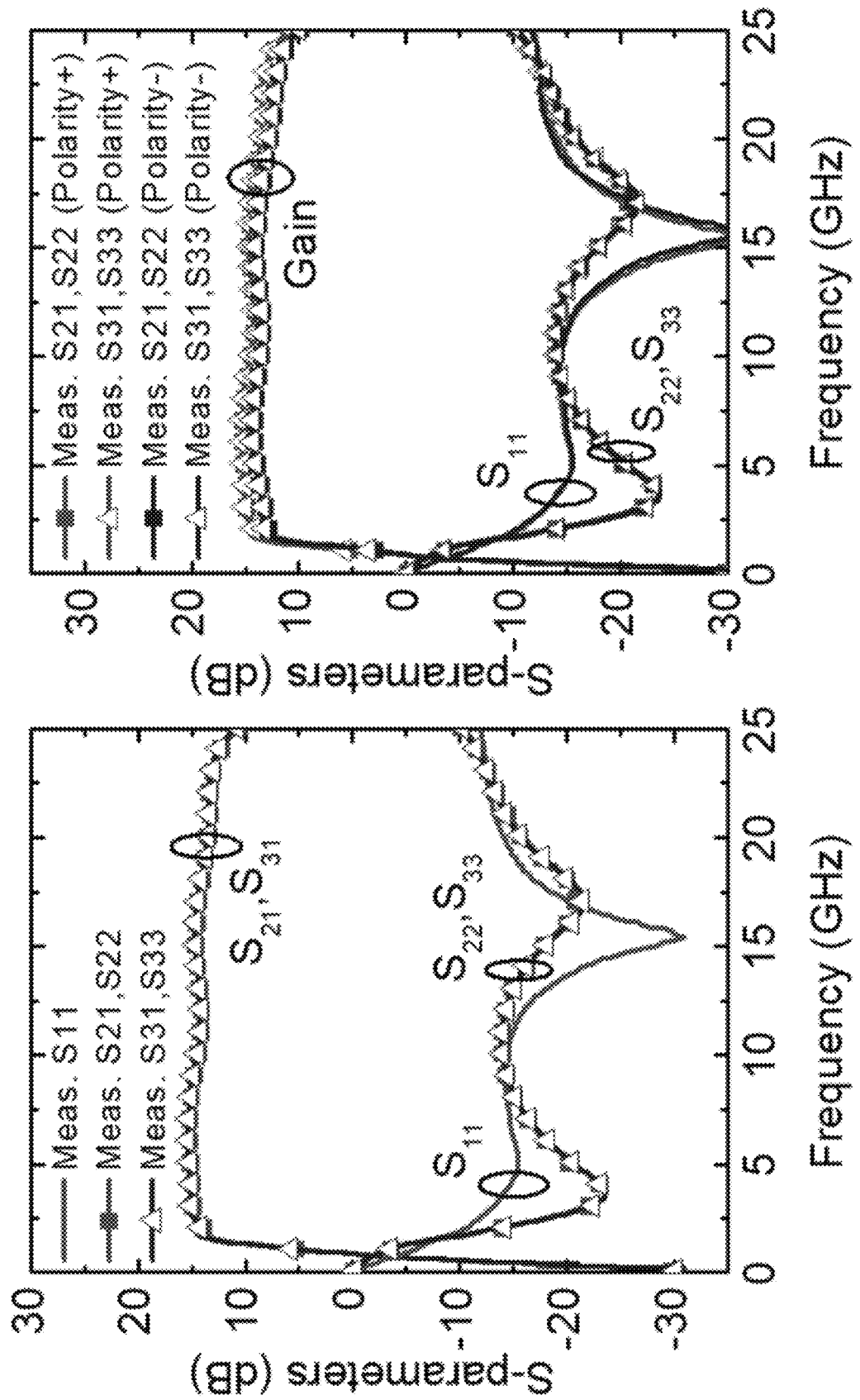

As shown in FIG. 9A, a flat in-band characteristic of 14.3 dB with ±0.9 dB variation was achieved by the fabricated circuit 800, and the input and output return loss were better than 10 dB from 2 to 20 GHz. FIG. 9B depicts the measured S-parameters at the output ports of the fabricated circuit 800. As shown in FIG. 9B, the circuit exhibits a flat gain response (S21, S31) and good matching characteristics (S11, S22, S33) over its functional bandwidth. FIG. 9C depicts the measured S-parameters at the output ports of the fabricated circuit 800 depending on polarity control. As shown in FIG. 9C, both the negative and positive polarities of the fabricated circuit 800 showed identical performance.

Figures 9D, 9E:
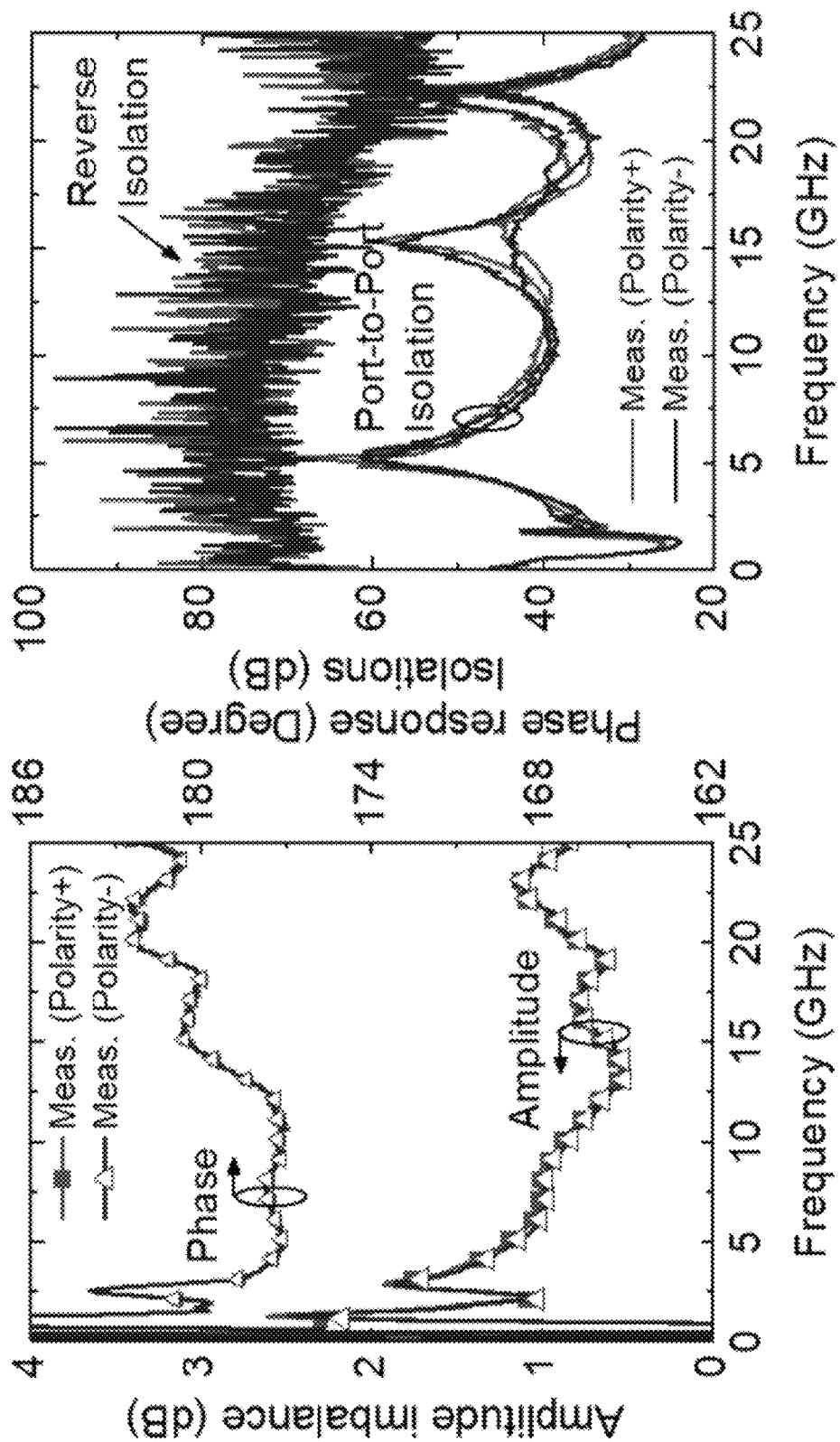

FIG. 9D depicts the measured amplitude and phase imbalance at the output ports of the fabricated circuit 800 depending on polarity control. As shown in FIG. 9D, the fabricated circuit 800 exhibits maximum phase mismatch of 4° and a maximum amplitude mismatch of 2 dB at low frequencies. As will be appreciated, the port-to-port and reverse isolations are critical for achieving high tap-to-tap isolation, which is required to prevent undesired signal coupling between adjacent taps. FIG. 9E depicts the measured isolation characteristics between the open loop control port 835 and the output port 840, in addition to the reverse isolation from the open loop control port 835 and the output port 840 to the input port 805. As shown in FIG. 9E, the measured port-to-port isolation of the fabricated circuit 800 was better than 25 dB and the measured reverse isolation was better than 50 dB from 2 to 20 GHz.

Figure 9G:
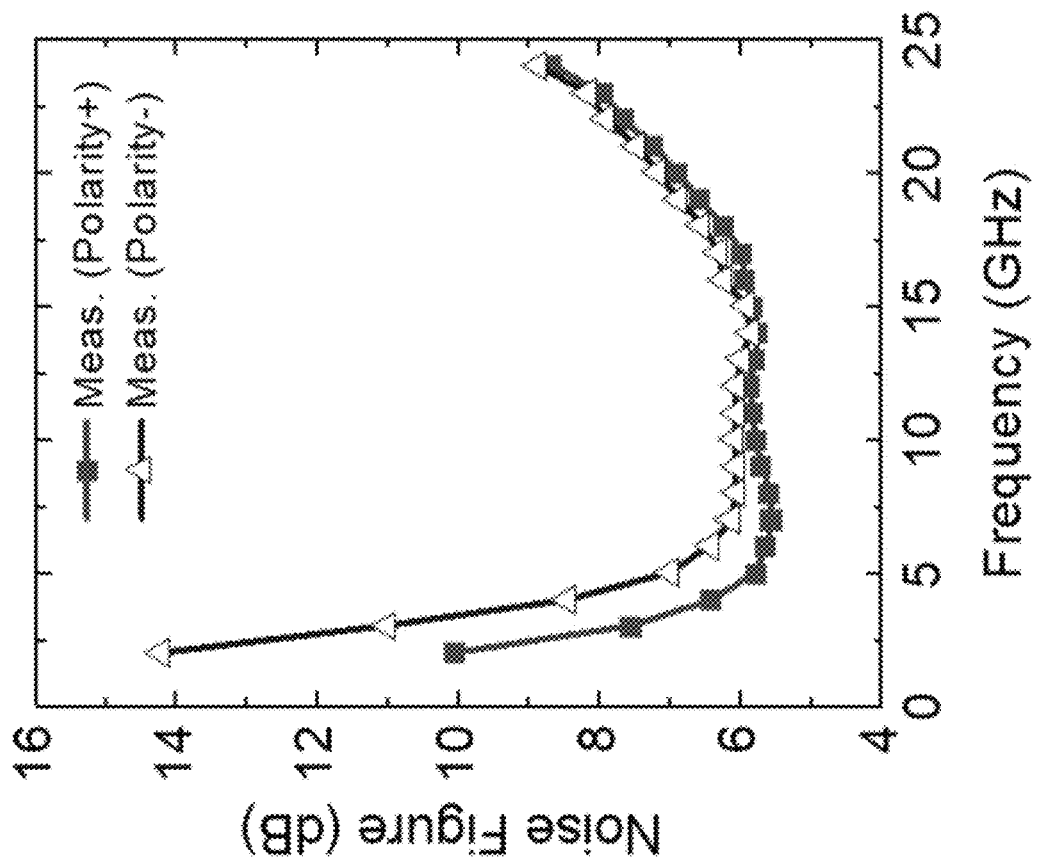
Figure 9F:
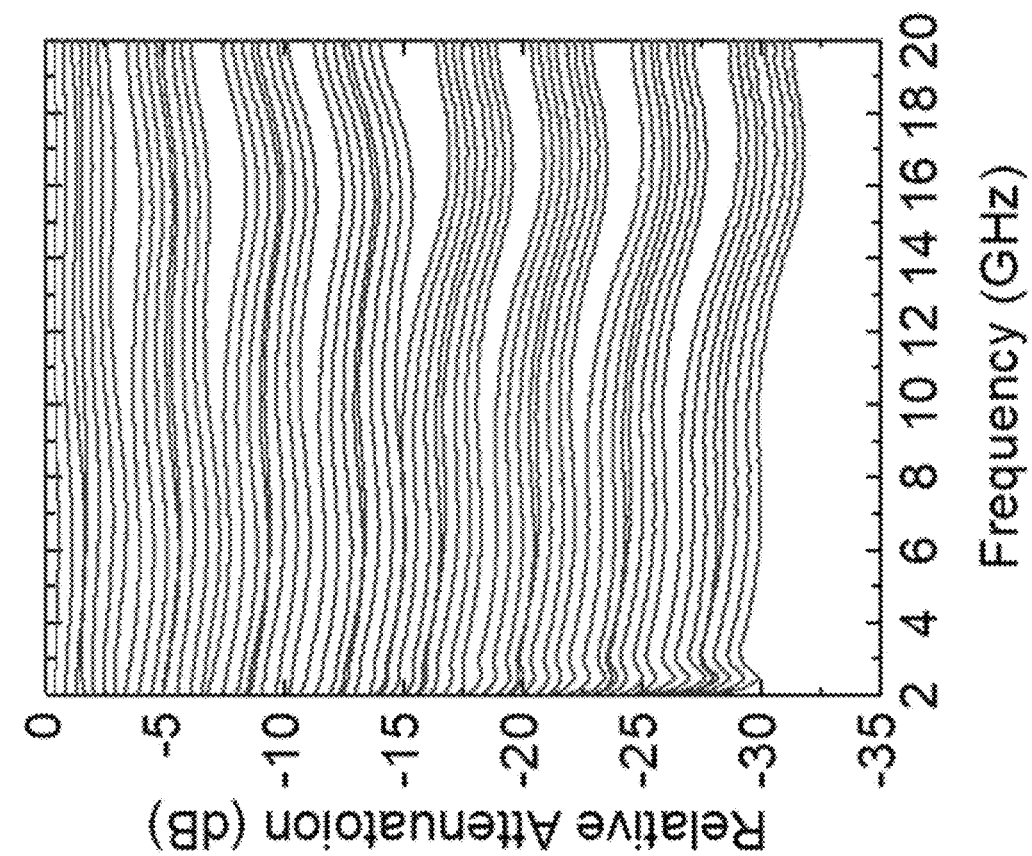

FIG. 9F depicts the measured relative attenuation for the fabricated circuit 800. As shown in FIG. 9F, the fabricated circuit 800 achieved a 31.5 dB total amplitude control range with a least significant bit (LSB) of 0.5 dB. FIG. 9G depicts the measured noise figure of the fabricated circuit 800 depending on polarity selection. Further, the measured root-mean-square (RMS) amplitude error and time variation of the fabricated circuit 800 were smaller than 0.7 dB and 2 ps from 4 to 20 GHz, respectively. As shown in FIG. 9G, the fabricated circuit 800 achieved 5.8 dB NF at 10 GHz.

The specific configurations, machines, and the size and shape of various elements can be varied according to particular design specifications or constraints requiring circuits 200a, 200b, 300, 400, 800 and other components described herein, or method(s) constructed according to the principles of this disclosure. Such changes are intended to be embraced within the scope of this disclosure. The presently disclosed examples, therefore, are considered in all respects to be illustrative and not restrictive. The scope of the disclosure is indicated by the appended claims, rather than the foregoing description, and all changes that come within the meaning and range of equivalents thereof are intended to be embraced therein.

As used in this application, the terms "component," "module," "system," "server," "processor," "memory," and the like are intended to include one or more computer-related units, such as but not limited to hardware, firmware, a combination of hardware and software, software, or software in execution. For example, a component may be, but is not limited to being, a process running on a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Certain examples and implementations of the disclosed technology are described above with reference to block and flow diagrams of systems and methods and/or computer program products according to example examples or implementations of the disclosed technology. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, may be repeated, or may not necessarily need to be performed at all, according to some examples or implementations of the disclosed technology.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks.

As an example, examples or implementations of the disclosed technology may provide for a computer program product, including a computer-usable medium having a computer-readable program code or program instructions embodied therein, said computer-readable program code adapted to be executed to implement one or more functions specified in the flow diagram block or blocks. Likewise, the computer program instructions may be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

In this description, numerous specific details have been set forth. It is to be understood, however, that implementations of the disclosed technology may be practiced without these specific details. In other instances, well-known methods, structures, and techniques have not been shown in detail in order not to obscure an understanding of this description. References to "one embodiment," "an embodiment," "some examples," "example embodiment," "various examples," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrase "in one implementation" does not necessarily refer to the same implementation, although it may.

Throughout the specification and the claims, the following terms take at least the meanings explicitly associated herein, unless the context clearly dictates otherwise. The term "connected" means that one function, feature, structure, or characteristic is directly joined to or in communication with another function, feature, structure, or characteristic. The term "coupled" means that one function, feature, structure, or characteristic is directly or indirectly joined to or in communication with another function, feature, structure, or characteristic. The term "or" is intended to mean an inclusive "or." Further, the terms "a," "an," and "the" are intended to mean one or more unless specified otherwise or clear from the context to be directed to a singular form. By "comprising," "containing," or "including" it is meant that at least the named element, or method step is present in article or method, but does not exclude the presence of other elements or method steps, even if the other such elements or method steps have the same function as what is named.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain examples of this disclosure have been described in connection with what is presently considered to be the most practical and various examples, it is to be understood that this disclosure is not to be limited to the disclosed examples, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain examples of the technology and also to enable any person skilled in the art to practice certain examples of this technology, including making and using any apparatuses or systems and performing any incorporated methods. The patentable scope of certain examples of the technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A circuit comprising:
   one or more tap signal paths, each tap signal path comprising:
      an input;
      a coefficient control mechanism;
      a polarity selection mechanism; and
      an output; and
   one or more time delay elements, each time delay element comprising:
      an input; and
      an output.

2. The circuit of claim 1, wherein the circuit is a reconfigurable filter for tunable filtering across frequencies from 2 to 20 gigahertz.

3. The circuit of claim 1, wherein components of the circuit are dynamically reconfigurable RF components configured to provide one or more features selected from a group consisting of:
   adjustable RF front-end filtering;
   pre-linearization of a signal for amplifier saturation compensation;
   direct throughput matched filtering; and
   a combination thereof.

4. The circuit of claim 1 further comprising:
   an input signal path; and
   an output signal path;
   wherein the input signal path is connected to each of the tap signal path inputs;
   wherein each tap signal path output is connected to a respective one of the time delay element inputs; and
   wherein each of the tap signal path outputs is connected to the output signal path.

5. The circuit of claim 4 further comprising:
   a first power divider connected between the input signal path and at least one of the one or more tap signal path inputs.

6. The circuit of claim 5 further comprising:
   a second power divider connected between at least one of the one or more time delay element outputs and the output signal path.

7. A circuit comprising:
   single taps, each of the single taps comprising:
      a coefficient control mechanism; and
      a polarity selection mechanism;
   time delay elements; and
   an output signal path;
   wherein the time delay elements are connected between the single taps and the output signal path.

8. The circuit of claim 7 further comprising:
   a first power divider connected to the single taps; and
   a second power divider connected between the time delay elements and the output signal path.

9. The circuit of claim 7, wherein the circuit is a reconfigurable filter for tunable filtering across frequencies from 2 to 20 gigahertz; and
   wherein components of the circuit are dynamically reconfigurable RF components configured to provide one or more features selected from a group consisting of:
   adjustable RF front-end filtering;
   pre-linearization of a signal for amplifier saturation compensation;
   direct throughput matched filtering; and
   a combination thereof.

10. An integrated circuit comprising:
    a first power divider connected to tap signal paths; and
    an output signal path connected to an output of each tap signal path;
    wherein each tap signal path comprises:
       a coefficient control mechanism;
       a polarity selection mechanism; and
       a time delay element.

11. The integrated circuit of claim 10, wherein one or more of:
    the coefficient control mechanism is selected from a group consisting of a wideband digital step attenuator, a variable digital attenuator, a variable analog attenuator, a variable gain amplifier, a vector modulator, and a combination thereof;
    the polarity selection mechanism comprises one or more components selected from a group consisting of a switch, an active balun, a passive balun, a transformer, a phase shifter, a vector modulator, and a combination thereof, or
    the time delay element is selected from a group consisting of a fixed delay element, a variable delay element, and a combination thereof.

12. The integrated circuit of claim 10 further comprising a field-programmable gate array configured to control one or more of the coefficient control mechanism, the polarity selection mechanism, or the time delay element being a variable time delay element.

13. The integrated circuit of claim 10, wherein the integrated circuit is a transversal radio frequency filter integrated circuit; and
    wherein the circuit further comprises a wideband reconfigurable transceiver connected to one of an input signal path and the output signal path.

14. The integrated circuit of claim 10 further comprising:
    a first amplifier; and
    a second power divider;
    wherein the integrated circuit is a transversal radio frequency filter integrated circuit;
    wherein the first power divider is connected between the first amplifier and tap signal paths; and
    wherein the second power divider is connected between the output of each tap signal path and the output signal path.

15. The integrated circuit of claim 14, wherein one or more of:
- the first power divider comprises a wideband active power divider;
- the second power divider comprises a Wilkinson Power Divider;
- a time delay of each of the tap signal paths is configured to provide a fixed time delay to a signal traversing the corresponding tap signal path;
- the time delay of each of the tap signal paths is in an active inductance peaking delay configuration;
- the coefficient control mechanism comprises a wideband digital step attenuator configured to support high control range of the coefficient control mechanism; or
- the polarity selection mechanism comprises a wideband balun and a switch.

* * * * *